(12) United States Patent
Kim et al.

(10) Patent No.: US 7,586,966 B2
(45) Date of Patent: Sep. 8, 2009

(54) SEMICONDUCTOR LASER DIODE FORMED WITH WINDOW AT CLEAVAGE FACET AND FABRICATING METHOD THEREOF

(75) Inventors: Chi Sun Kim, Seoul (KR); Ji Na Jeon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/105,973

(22) Filed: Apr. 18, 2008

(65) Prior Publication Data
US 2008/0259982 A1 Oct. 23, 2008

(30) Foreign Application Priority Data
Apr. 20, 2007 (KR) .................. 10-2007-0038976

(51) Int. Cl.
*H01S 5/00* (2006.01)

(52) U.S. Cl. ..................................... 372/44.01; 438/31

(58) Field of Classification Search .................. 372/26, 372/44.01, 46.01, 46.015; 438/31; 257/96; 385/2
See application file for complete search history.

(56) References Cited

U.S. PATENT DOCUMENTS

| 6,583,510 | B2 * | 6/2003 | Hanamaki et al. ........... 257/775 |
| 2008/0198886 | A1 * | 8/2008 | Michiue et al. ........ 372/44.011 |

* cited by examiner

*Primary Examiner*—Minsun Harvey
*Assistant Examiner*—Tuan N. Nguyen
(74) *Attorney, Agent, or Firm*—Birch, Stewart, Kolasch & Birch, LLP

(57) ABSTRACT

The semiconductor laser diode formed with a window at a cleavage facet and a fabricating method thereof are disclosed, wherein a ridge adjacent to a cleavage facet of the semiconductor laser diode and part of the p-clad layer underneath the ridge are etched to form a window, such that a current is not applied to along the cleavage facet to thereby prevent the cleavage facet from being degraded and to enhance reliability of the diode.

20 Claims, 9 Drawing Sheets

SEMICONDUCTOR LASER DIODE FORMED WITH WINDOW AT CLEAVAGE FACET AND FABRICATING METHOD THEREOF

CROSS-REFERENCE TO RELATED APPLICATION

This application is based on, and claims priority from Korean Patent Application Number 10-2007-0038976 filed Apr. 20, 2007, the disclosure of which is incorporated herein in its entirety by reference.

BACKGROUND ART

The following description generally relates to a semiconductor laser diode and a method for fabricating the same, and more particularly to a semiconductor laser diode formed with window at cleavage facet and fabricating method thereof.

A semiconductor laser diode generates a laser beam having frequency of a narrow width and keen directivity and is thus mainly used in a field such as optical communication, a multiple communication and a space communication. Also, the semiconductor laser diode is extensively used for transmission of data or recording and reading of data in a communication field such as an optical communication and an apparatus such as a compact disc player (CDP) and a digital versatile disc player (DVDP). The semiconductor laser diode also may be applicable as devices with improved speed for data transmission or certain read/write functions in players using optical discs.

Among semiconductor light emitting devices, semiconductor laser devices are used as light sources for reading and writing of a signal of an optical recording medium such as CD (Compact Disk), DVD (Digital Versatile Disk) or Blue-Ray Disk. When a semiconductor laser device is used as a light source for writing, a higher-power semiconductor laser device is required because of increased speed and increased capacity of multi-layering media. Therefore, nitride semiconductor laser devices adapted to high power, for each wavelength of infrared, red, blue or the like, have been developed and are stilt now under development.

The extensive use of the semiconductor laser diode is due to facts that the emission characteristics of a laser beam can be maintained in a limited space and the semiconductor laser diode is a compact device and has a small critical current value for emission. An increase in the number of industrial fields adopting the semiconductor laser diode results in an increase in a need for a semiconductor laser diode having a more reduced critical current value. That is, it is required to manufacture an excellent semiconductor laser diode capable of enabling low-current emission and having longer lifetime.

Since a semiconductor laser device may maintain oscillation characteristics of laser beam in a limited space, may be formed to a small scale, and requires a small critical current for laser oscillations, the semiconductor laser device is widely used. As the number of industrial fields to which the semiconductor laser is applied increases, demand for semiconductor laser devices requiring for a smaller critical current increases. In other words, semiconductor laser devices having excellent characteristics, such as oscillating at a low current, and the ability to pass a lifespan test are needed.

For example, a nitride semiconductor laser diode, for example, gallium nitride (GaN)-based laser diode may allow using wavelengths from the ultraviolet region to the visible-green region of the electromagnetic spectrum. The GaN-based laser diodes may be applicable in various areas, including storage/reproduction devices using increased density optical information, laser printers with increased resolution, and projection televisions.

The nitride semiconductor laser diode has gained a good reception in terms of environment-friendly aspect of view due to the fact that it does not use arsenic (As) for main components.

The semiconductor laser diode employed for light source of optical devices must satisfy a single mode and high output power characteristics. To this end, the semiconductor laser diode for light source must be disposed with a ridge waveguide structure that provides a function to confine the current and requires a small critical current for laser oscillations.

The GaN-based laser diodes may have a multi-layered structure of an epitaxial layer including an active layer for emitting laser beam to an upper surface of a sapphire substrate, the epitaxial layer being formed thereon with a ridge, the ridge being formed thereon with a p-electrode, and the epitaxial layer is partially mesa-etched and exposed to form an n-electrode.

When a current is applied from the p-electrode via the ridge, light is produced from the active layer in response to hole-electron recombination. The light produced by the active layer reciprocates between a front cleavage facet and a back cleavage facet, is amplified and emitted outside if resonance conditions are met. A high reflection film is formed on the back cleavage facet to reflect the laser beam to allow the laser beam to be emitted only through the front cleavage facet of the semiconductor laser diode, and the front cleavage facet is formed with an anti-reflection film to prevent the laser beam from being reflected.

Meanwhile, degradation and local segregation may often become severe in the facets of high output semiconductor laser diodes. Poor reliability that shortens the service life of the semiconductor laser diode resulting from degradation of the semiconductor laser diodes on the facet at the light emitting side is known as a big problem in achieving higher power of the semiconductor laser device. This is commonly known as COD (Catastrophic Optical Damage) which is a phenomenon in which the light emitting portion is thermally melted thereby causing emission stop. The reason the COD occurs is that the light emitting portion becomes an absorption region in which laser light is absorbed to generate heat and result in a reduced energy band gap. It is said that non-radiative recombination level is attributable to the absorption region. The light emitting portion of the nitride semiconductor laser device in which laser light emission stops is found to have a hole which may be created as the light emitting portion is melted, and it is understood that the degradation of the light emitting portion causes emission stop.

The conventional nitride semiconductor laser diode is configured in such a manner that p-contact layer and p-pad electrode are formed up to the cleavage facets of the semiconductor laser diode.

If a voltage is applied to the p-pad electrode, holes are introduced along the cleavage facets of the semiconductor laser diode through the p-contact layer, and when the holes are recombined with the electrons to generate light, light absorption becomes high at the cleavage facets to aggravate the degradation on the facets.

SUMMARY

The object of the instant novel disclosure is to provide a semiconductor laser diode formed with window at cleavage facet and fabricating method thereof.

In one general aspect, a semiconductor laser diode formed with window may comprise: a stacked structure sequentially comprised of, on an upper surface of a substrate, an n-contact layer, an n-clad layer, an n-waveguide layer, an active layer, an electron blocking layer (EBL), a p-waveguide layer; a ridge layer comprised of a p-clad layer protrusively formed at a central portion thereof on an upper surface of the p-waveguide layer and a p-contact layer formed on an upper surface of the protrusive p-clad layer; and a window formed at a predetermined depth by etching a ridge adjacent to a cleavage facet.

In another general aspect, a semiconductor laser diode formed window may comprise: a substrate sequentially formed thereon with an n-contact layer, an n-clad layer, an n-waveguide layer, an active layer, an electron blocking layer (EBL), a p-waveguide layer; the n-contact layer being partially exposed by being mesa-etched from the p-waveguide layer to part of the n-contact layer; a ridge formed with a p-clad layer protrusively formed at a central portion thereof on an upper surface of the p-waveguide layer and a p-contact layer formed on an upper surface of the protrusive p-clad layer; a protective film formed on a lateral surface of the ridge and the upper surface of the p-clad layer; a window formed by etching a ridge adjacent to a cleavage facet and part of the p-clad layer underneath the ridge; and a p-pad electrode formed to cover the p-contact layer and the part of the protective film, and an n-pad electrode formed on the exposed n-contact layer.

In still another general aspect, a semiconductor laser diode formed with window may comprise: a substrate sequentially formed thereon with an n-contact layer, an n-clad layer, an n-waveguide layer, an active layer, an electron blocking layer (EBL), a p-waveguide layer; the p-waveguide layer formed thereon with a central portion protruded p-clad layer and the protruded p-clad layer being formed thereon with the p-contact layer to form a ridge; a protective film formed on a lateral surface of the ridge and the upper surface of the p-clad layer; a window formed by etching a ridge adjacent to a cleavage facet and part of the p-clad layer underneath the ridge; and a p-pad electrode formed to cover the p-contact layer and the part of the protective film, and an n-pad electrode formed at a bottom surface of the substrate, wherein the window is formed at least either adjacent to a front cleavage facet or a back cleavage facet, and a length of the window is in the range of 1~300 μm, and a distance between the active layer and the window is in the range of 1000~5000 Å.

In still another general aspect, a method for fabricating a semiconductor laser diode formed with window may comprise: sequentially stacking on an upper surface of a substrate an n-contact layer, an n-clad layer, an n-waveguide layer, an active layer, an electron blocking layer (EBL) and a p-waveguide layer; mesa-etching from the p-waveguide layer to part of the n-contact layer to expose part of the n-contact layer; forming on the p-waveguide layer a central portion protruded p-clad layer and forming a p-contact layer on the protruded p-clad layer to form a ridge; forming a protective film on a lateral surface of the ridge and an upper surface of the p-clad layer; etching the ridge adjacent to a cleavage facet and part of the p-clad layer underneath the ridge to form a window; and covering the p-contact layer and part of the protective layer to form a p-pad electrode and forming an n-pad electrode at an upper surface of the exposed n-contact layer.

In still another general aspect, a method for fabricating a semiconductor laser diode formed with window may comprise: sequentially stacking on an upper surface of a substrate an n-contact layer, an n-clad layer, an n-waveguide layer, an active layer, an electron blocking layer (EBL) and a p-waveguide layer; forming on the p-waveguide layer a central portion protruded p-clad layer and forming a p-contact layer on the protruded p-clad layer to form a ridge; forming a protective film on a lateral surface of the ridge and an upper surface of the p-clad layer; etching the ridge adjacent to a cleavage facet and part of the p-clad layer underneath the ridge to form a window; and covering the p-contact layer and part of the protective layer to form a p-pad electrode and forming an n-pad electrode at a bottom surface of the substrate.

Implementations of this aspect may include one or more of the following features.

The step of forming the window may comprise: sequentially forming a hard mask and a photosensitive polymer on an upper surface of the p-contact layer and the protective film; patterning the photosensitive polymer in order to expose a region adjacent to the cleavage facet and then etching the hard mask; etching by using the hard mask as the etch mask from the p-contact layer adjacent to the cleavage facet to part of the p-clad layer.

The hard mask may include any one material selected from a group consisting of Ni, Cr, Pt, Cu, Ti, Al, $SiO_2$, SiN, $Al_2O_3$ and $TiO_2$.

BRIEF DESCRIPTION OF THE DRAWINGS

These and/or other aspects and advantages of the present general inventive concept will become apparent and more readily appreciated from the following description of the implementations, taken in conjunction with the accompanying drawings of which.

DETAILED DESCRIPTION

It is to be understood that both the foregoing general description and the following detailed description are exemplary and explanatory only and are intended to easily provide a general concept and principle of the various implementations of the present teachings.

Figure 1:
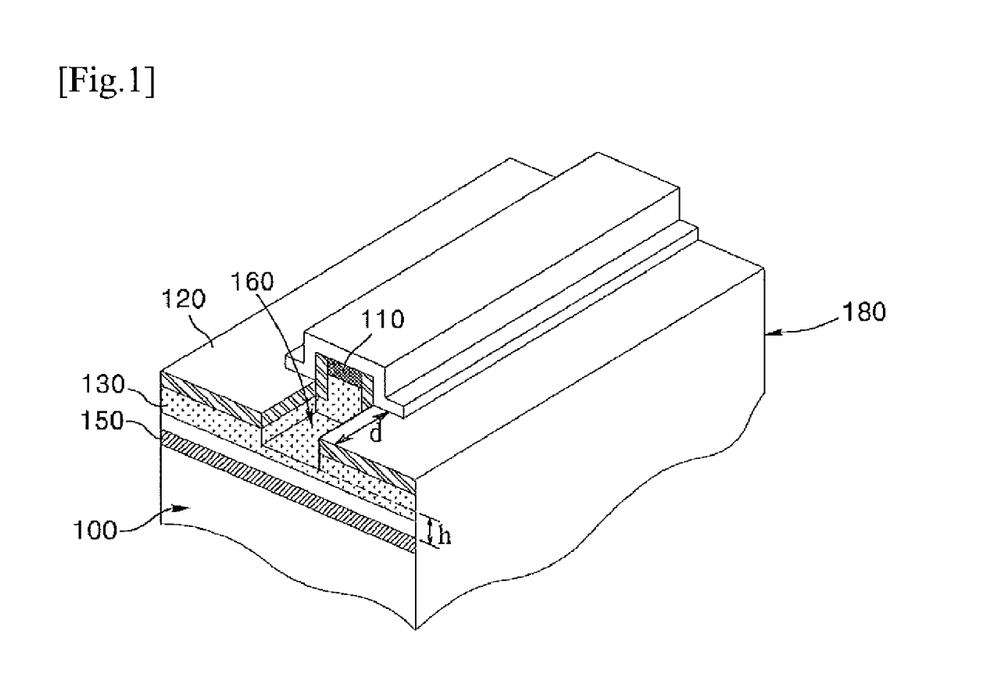
FIG. 1 is a partial perspective view of a semiconductor laser diode formed with window at a cleavage facet.

Referring to FIG. 1, a ridge at a front cleavage facet 100 and part of a p-clad layer 130 may be etched to be exposed upwards. In other words, the front cleavage facet 100 may be etched from a p-contact layer 110 to part ÅA length (d) of the window 160 may be within half the length of a resonator in a semiconductor laser diode but preferably within 1 μm~300 μm. If the length (d) of the window is 1 μm or less, there is a high probability of holes being doped along the front cleavage facet 100, making it difficult to prevent the degradation of the front cleavage facet 100. If the length (d) of the window 160 is longer than 300 µm, there occurs a difficulty in holes being doped into an active layer 150 due to high resistance. Furthermore, a distance (d) of the window 160 detached the active layer 150 is preferably in the range of 1000 Å~5000 Å. It is understood that the formation of window 160 at the front cleavage facet 100 which is a light emitting portion may prevent a current from being doped along the front cleavage facet 100, thereby minimizing the degradation of the cleavage facet. In doing do, the problem of reduced reliability due to degradation of the light emitting portion in the semiconductor laser diode can be obviated.

Meanwhile, the window 160 may be formed on a front cleavage facet 100 and on a back cleavage facet 180 as well. Each length of the window 160 formed on the front and back cleavage facets is preferably in the range of 1 µm~150 µm.

Figure 2:
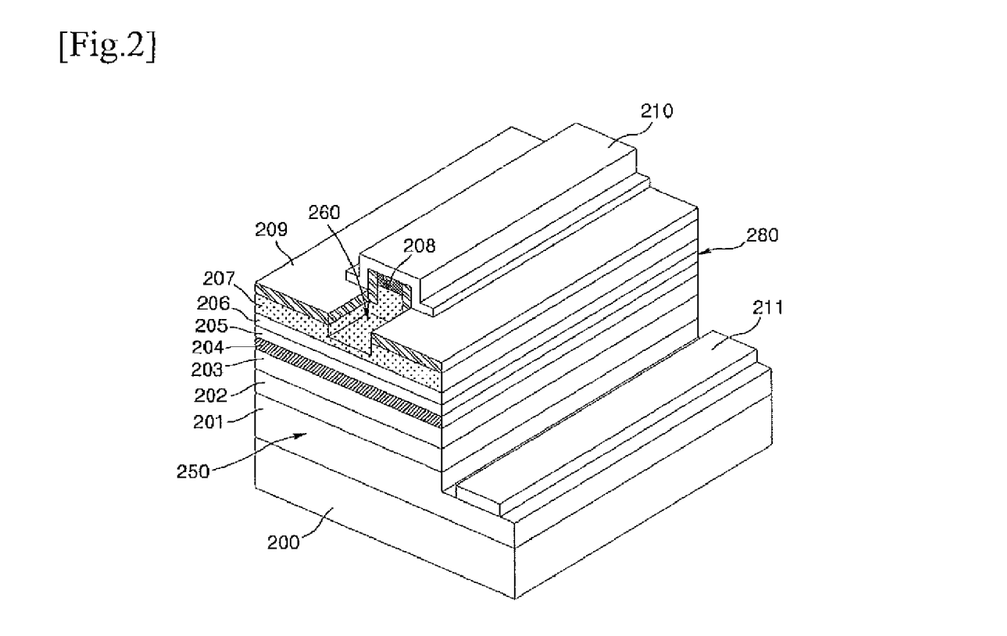
FIG. 2 is a perspective view of a first exemplary implementation of a semiconductor laser diode formed with a window on a cleavage facet.

Now, referring to FIG. 2, in a first exemplary implementation of a semiconductor laser diode formed with a window on a cleavage facet, a substrate 200 may be sequentially stacked thereon with an n-contact layer 201, an n-clad layer 202, an n-waveguide layer 203, an active layer 204, an electron blocking layer (EBL, 205) and a p-waveguide layer 206.

A mesa-etching may be performed from the p-waveguide layer 206 to part of the n-contact layer 201 to expose part of part of the n-contact layer, an upper surface of the p-waveguide layer 206 may be formed with a central portion protruded p-clad layer 207, and the central portion protruded p-clad layer 207 may be formed thereon with the p-contact layer 208 to form a ridge.

A lateral surface of the ridge and an upper surface of the p-clad layer 207 may be formed with a protective film 209. A ridge adjacent to a front cleavage facet 250 from which light generated by the active layer 204 is emitted and part of the p-clad layer 207 may be etched to form a window 260, a p-pad electrode 210 may be formed to cover the p-contact layer 208 and part of the protective film 209, and an n-pad electrode 211 may be formed on an upper surface of the exposed n-contact layer 201.

A structure of forming a p-pad electrode 210 and an n-pad electrode 211 on the same planar surface in a semiconductor laser diode is called a top-top stacking configuration of a semiconductor laser diode.

In a top-top stacking configuration, a sapphire which is an insulation material may be employed for the substrate 200, such that a mesa-etching is performed from the p-waveguide layer 206 to part of the n-contact layer 201 to expose part of the n-contact layer 201, and the n-pad electrode 211 is formed on the exposed n-contact layer 201. The substrate 200 may be a sapphire ($Al_2O_3$) substrate, a silicon carbide (SiC) substrate, a silicon (Si) substrate, a gallium arsenide (GaAs) substrate, but a sapphire is preferably used for the substrate 200.

The n-contact layer 201 may be generally composed of an n-GaN layer, and the n-clad layer 202 may be represented by the Formula $In_xAl_yGa_{1-x-y}N$ ($0 \leq x<1$, $0 \leq y<1$, $0 \leq x+y<1$).

The n-waveguide layer 203 may be made of material having a refractive index lower than that of the active layer 204. The active layer 204 may be comprised of a single quantum well structure of a barrier layer represented by the Formula $In_xGa_1$—N ($0 \leq x<1$) and a well layer, or a multiple quantum well structure sequentially and repeatedly stacked with the barrier layers and the well layers.

The electron blocking layer (EBL, 205) may be composed of an AlGaN layer for preventing an overflow of electrons caused by low carrier concentration and mobility of p-type nitride semiconductor. Preferably, the EBL 205 is composed of AlGaN having a high Al composition (more than 20%) for an effective energy barrier function.

The p-waveguide layer 206 may be composed of material having a refractive index lower than that of the active layer 204 and may be mainly composed of p-GaN layer.

The p-clad layer 207 is composed of the same material layer as that of the n-clad layer 202, except that doped conductive impurities are different. In other words, the p-clad layer 207 is represented by the Formula $p-In_xAl_yGa_{1-x-y}N$ ($0 \leq x<1$, $0 \leq y<1$, $0 \leq x+y<1$).

The p-contact layer 208 is composed of the same material layer as that of the n-contact layer 201, except that doped conductive impurities are different. In other words, the p-contact layer 208 is composed of p-GaN and has a high doping concentration than that of the p-clad layer 207 in order to reduce a contact resistance with the p-pad electrode 210.

The protective film 209 may include any one material selected from a group consisting of $SiO_2$, $Si_3N_4$, $Al_2O_3$, HfO and $TiO_2$. The p-pad electrode 210 and the n-pad electrode 211 may be formed by any one metal selected from a group consisting of Cr, Ni, Au, Al, Ti and Pt, or a metal alloy of laminated structure selected from the group consisting of Cr, Ni, Au, Al, Ti and Pt.

Figure 3:
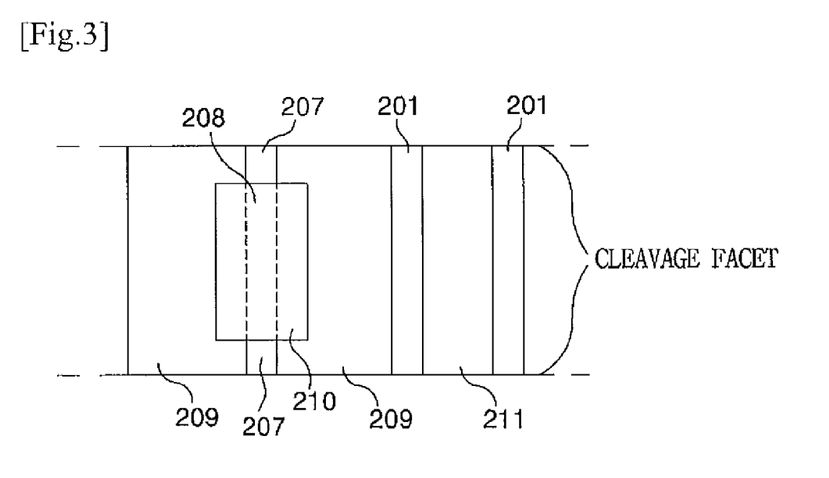
FIG. 3 is a plan of windows each formed at a front cleavage facet and a back cleavage facet of a semiconductor laser diode.

Meanwhile, the window 260 may be formed on a front cleavage facet 250 of the semiconductor laser diode or on a back cleavage facet 280 as well. FIG. 3 shows a planar view where a window is formed on the front cleavage facet 250 and the back cleavage facet 280 as well.

Figure 4A:
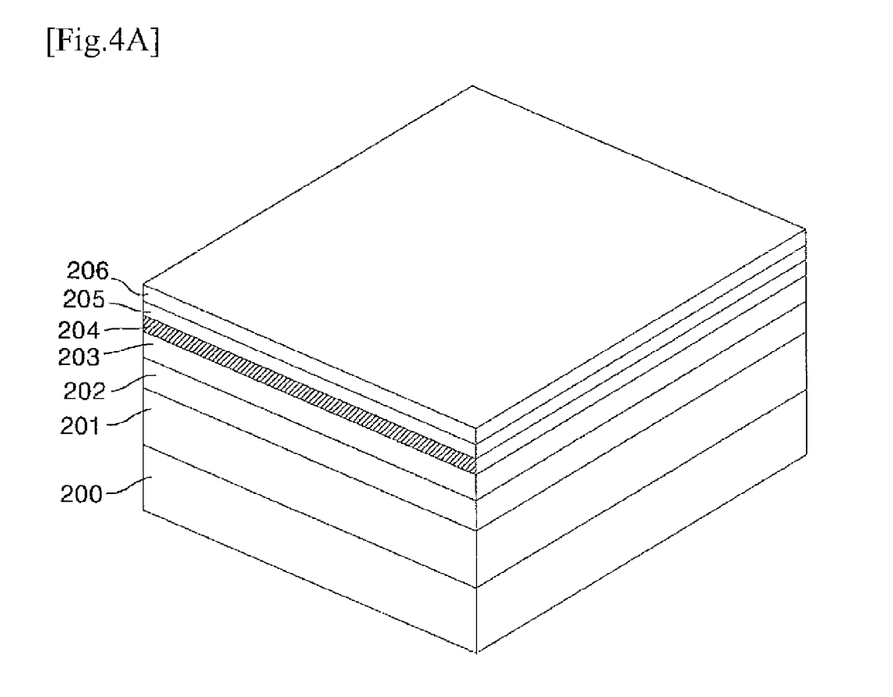
FIGS. 4a to 4f illustrate a first exemplary implementation of a method for fabricating a semiconductor laser diode formed with a window at a cleavage facet.

Now, referring to FIGS. 4a to 4f, a first exemplary implementation of a method for fabricating a semiconductor laser diode formed with a window at a cleavage facet may comprise: sequentially stacking on an upper surface of a substrate 200 an n-contact layer 201, an n-clad layer 202, an n-waveguide layer 203, an active layer 204, an electron blocking layer (205, EBL) and a p-waveguide layer 206 (FIG. 4a).

Figure 4B:
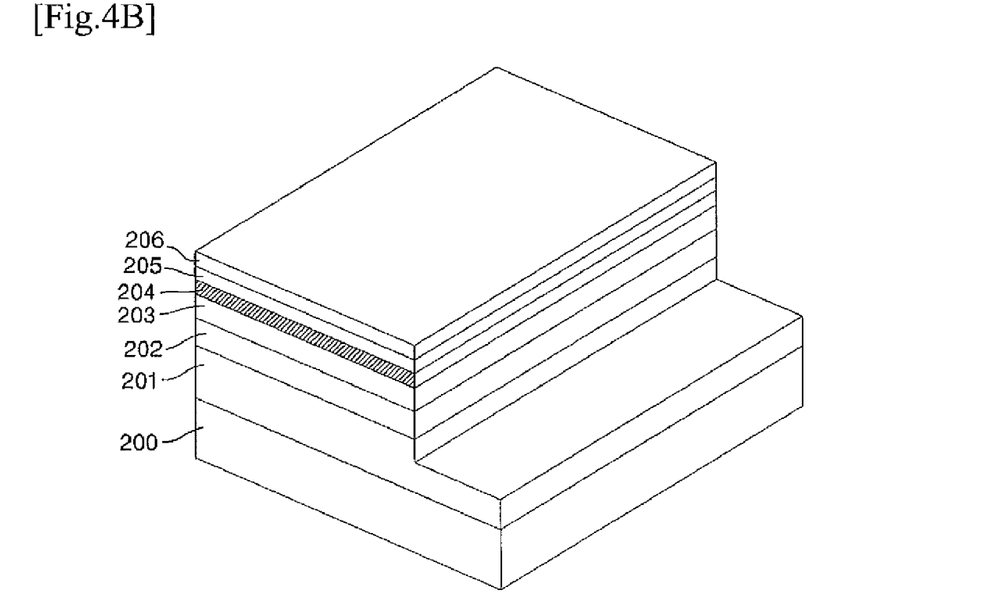

Successively, a mesa-etching may be performed from the p-waveguide layer 206 to part of the n-contact layer 201 to expose part of the n-contact layer 201 upwards (FIG. 4b).

Figure 4C:
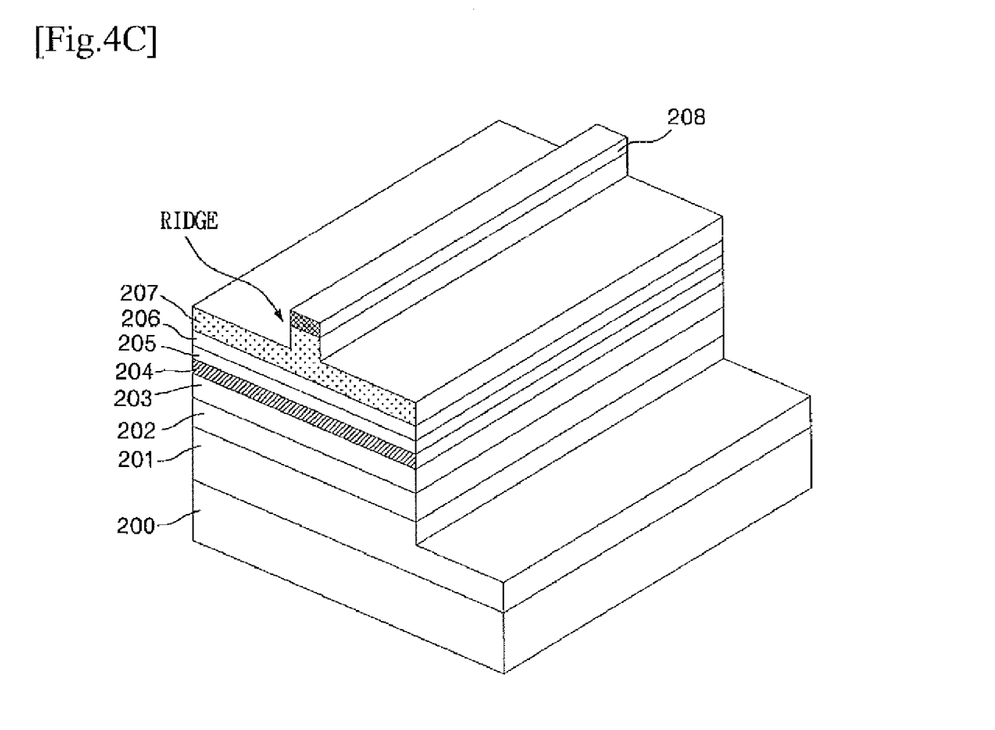

Next, the p-clad layer 207 whose central portion is protruded may be formed on an upper surface of the p-waveguide layer 206, and the p-contact layer 208 may be formed on an upper surface of the protruded p-clad layer 207 to form a ridge (FIG. 4c).

Figure 4D:
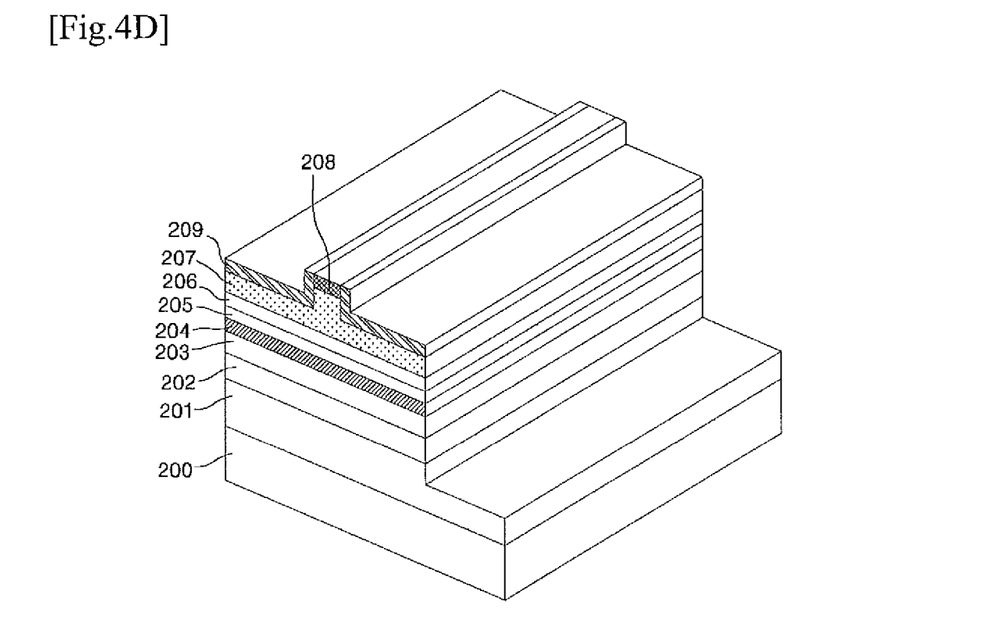

Thereafter, a protective film 209 may be formed on the lateral surface of the ridge and the upper surface of the p-clad layer 207 (FIG. 4d).

Figure 4E:
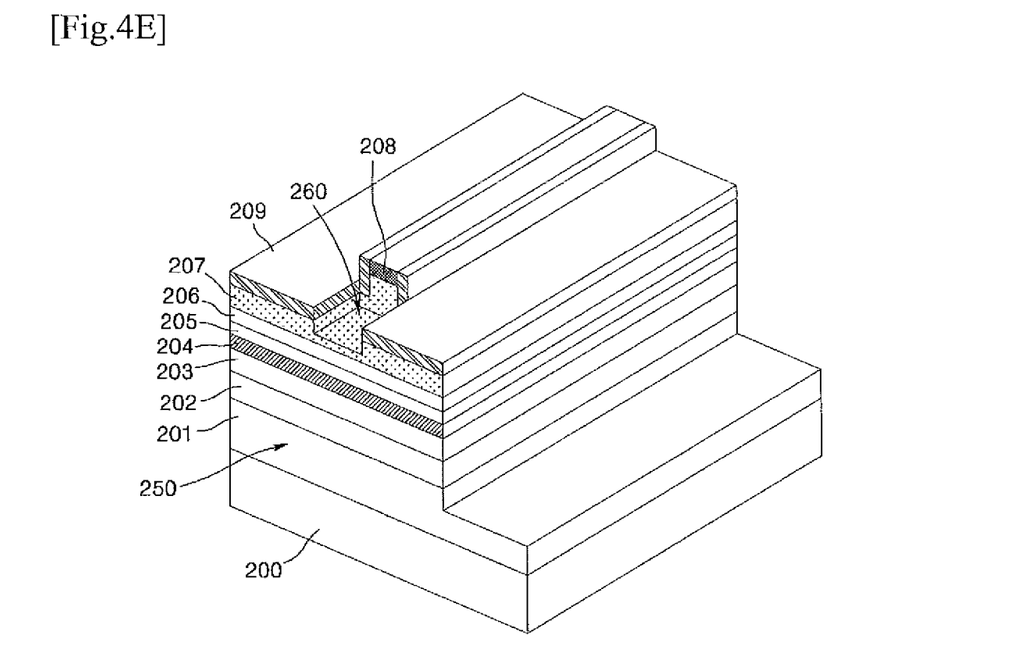

Then, the ridge adjacent to the front cleavage facet 250 and part of the p-clad layer 207 may be etched to form a window 260 (FIG. 4e).

Figure 4F:
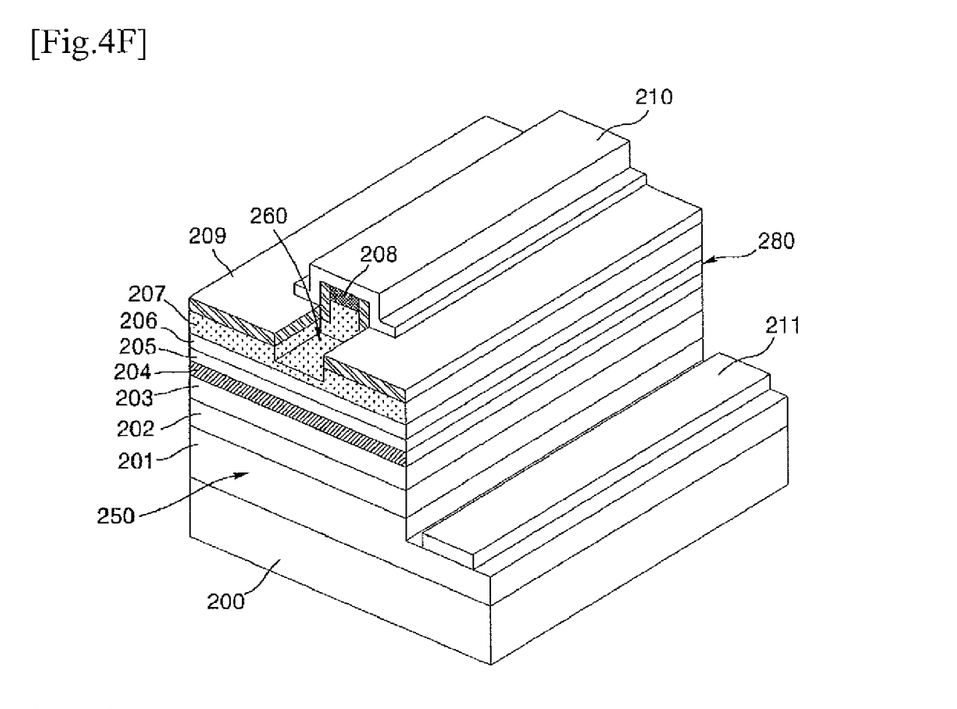

Finally, the p-clad electrode 210 may be formed to cover the p-contact layer 208 and part of the protective film 209, and the n-pad electrode 211 may be formed on an upper surface of the exposed n-contact layer 201 (FIG. 4f).

Now, a process of forming the window 260 will be illustrated in detail with reference to FIGS. 5a to 5c.

Figure 5A:
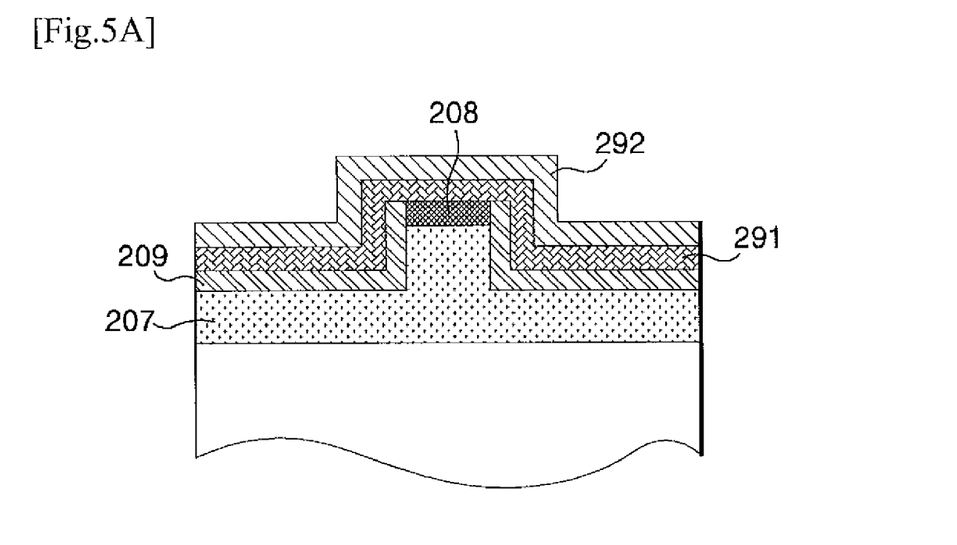
FIGS. 5a, 5b and 5c illustrate a process of forming a window on a cleavage facet.
Figure 5B:
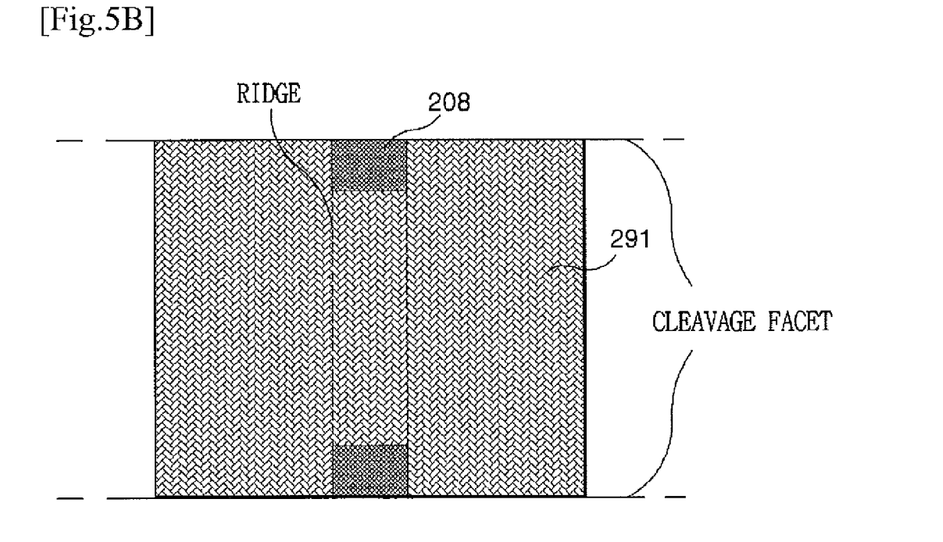

First, referring to FIG. 4d, the protective film 209 is formed on the lateral surface of the ridge and on the upper surface of the p-clad layer 207 (see FIG. 4d), and then, the p-contact layer 208 and the protective film 209 are sequentially formed thereon with hard mask 291 and the photosensitive polymer 292 (see FIG. 5a).

The hard mask may include any one material selected from a group consisting of Ni, Cr, Pt, Cu, Ti, Al, $SiO_2$, SiN, $Al_2O_3$ and $TiO_2$ and may be a single layer or a multiple layer composed of the above material.

Successively, light exposure or light development may be performed to pattern the photosensitive polymer 292 so that a partial region adjacent to the cleavage facet can be exposed, and the patterned photosensitive polymer 292 may be used as the etch-mask to etch the hard mask 291 and to remove the remaining photosensitive polymer 292. As a result of this process, the hard mask 291 adjacent to the cleavage facet is removed to expose the p-contact layer 208 as shown in FIG. 5b.

Figure 5C:
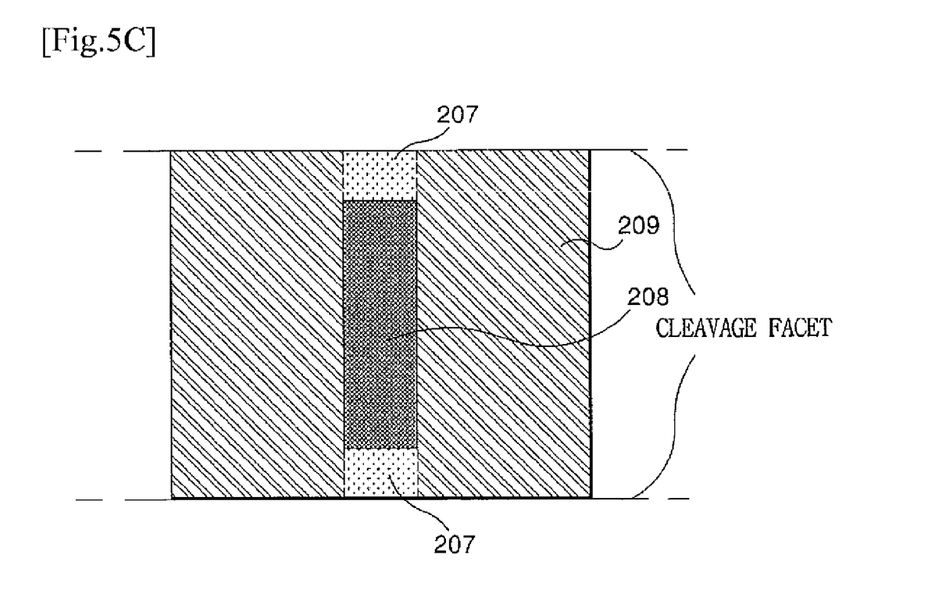

Next, the hard mask 291 may be used as the etch-mask to etch from the exposed p-contact layer 208 to the part of the p-clad layer 207 and to form a window adjacent to the cleavage facet (see FIG. 5c).

It should be apparent that the depth of etching be so adjusted as to allow the upper surface of the p-clad layer 207 to maintain a distance of 1000 Å~5000 Å from the active layer 204. In other words, the depth of etching must be adjusted lest the active layer 204 should be damaged.

Meanwhile, in the semiconductor laser diode of the present novel concept, the window may be formed by using the photosensitive polymer as the mask to etch a region adjacent to the cleavage facet at a predetermined depth following the formation of the p-pad electrode and the n-pad electrode in the conventional method.

Because all the nitride semiconductors are grown on the substrate to form the windows in the instant disclosure, the length, width of the window and etching depth can be easily adjusted and the nitride semiconductors can be grown in an in-situ condition. If, in order to prevent the COD from occurring on the cleavage facet, a substrate is formed with grooves, and the nitride semiconductors are grown on the substrate to allow the grooves to take shapes adjacent to the cleavage facet, it is difficult to meet the growth condition of the nitride semiconductors and to form groove shapes of desired sizes.

Figure 6:
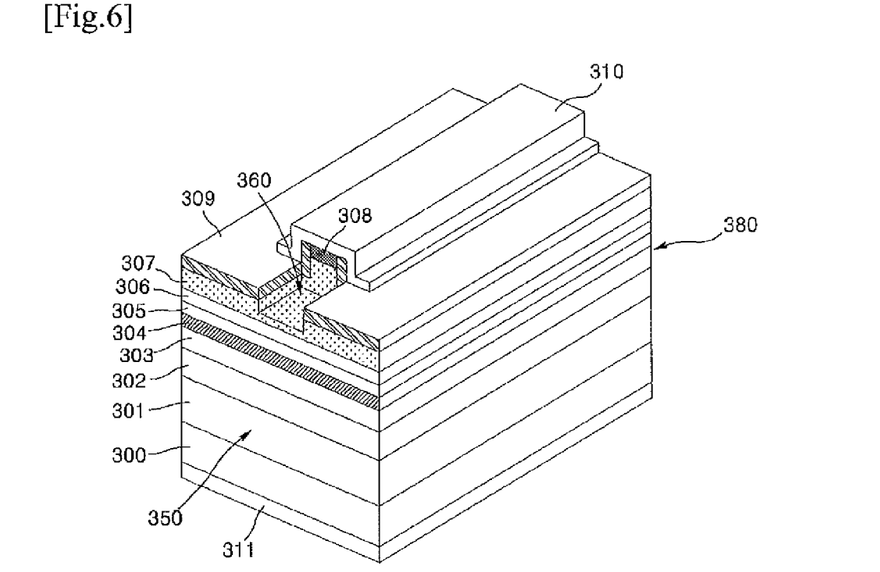
FIG. 6 is a perspective view of a second exemplary implementation of a semiconductor laser diode formed with a window on a cleavage facet.

Now, referring to FIG. 6, an upper surface of a substrate 300 is sequentially stacked with an n-contact layer 301, an n-clad layer 302, an n-waveguide layer 303, an active layer 304, an electron blocking layer (305, EBL) and a p-waveguide layer 306.

An upper surface of the p-waveguide layer 306 is formed with a central portion protruded p-clad layer 307, and an upper surface of the protruded p-clad layer 307 is formed with a p-contact layer 308 to form a ridge. A protective film 309 is formed on a lateral surface of the ridge and on an upper surface of the p-clad layer 307.

The ridge adjacent to a front cleavage facet 350 from which light generated from the active layer 304 is emitted and part of the p-clad layer 307 are etched to form a window.

A p-pad electrode 310 is formed to cover the p-contact layer 308 and part of the protective layer 309 and an n-pad electrode 311 is formed at a bottom surface of the substrate 300.

A structure of forming an n-pad electrode 311 at the bottom surface of a substrate 300 is called a top-down stacking configuration of a semiconductor laser diode, where a conductive substrate, i.e., an n-GaN substrate, is employed for the substrate 300. In the instant implementation as in the previous one, the window may be formed at the front cleavage facet 350 and the back cleavage facet 380 of the semiconductor laser diode as well.

Now, referring to FIGS. 7a to 7e, a method for fabricating a semiconductor laser diode formed with a window on a cleavage facet according to the second exemplary implementation will be described.

Figure 7A:
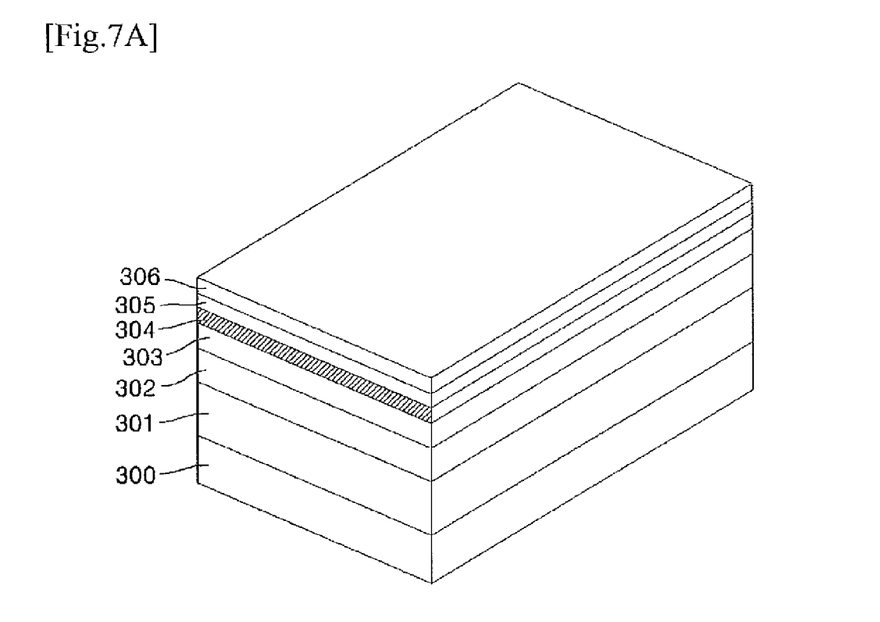
FIGS. 7a to 7e illustrate a second exemplary implementation of a method for fabricating a semiconductor laser diode formed with a window on a cleavage facet.

First, an upper surface of a substrate 300 is sequentially stacked with an n-contact layer 301, an n-clad layer 302, an n-waveguide layer 303, an active layer 304, an electron blocking layer (EBL, 305) and a p-waveguide layer 306 (see FIG. 7a).

Figure 7B:
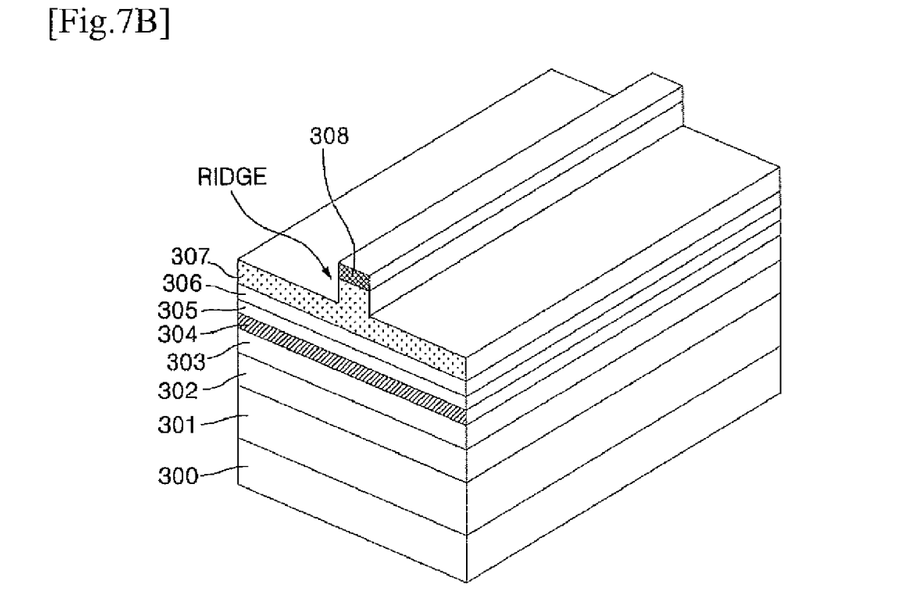
Figure 7C:
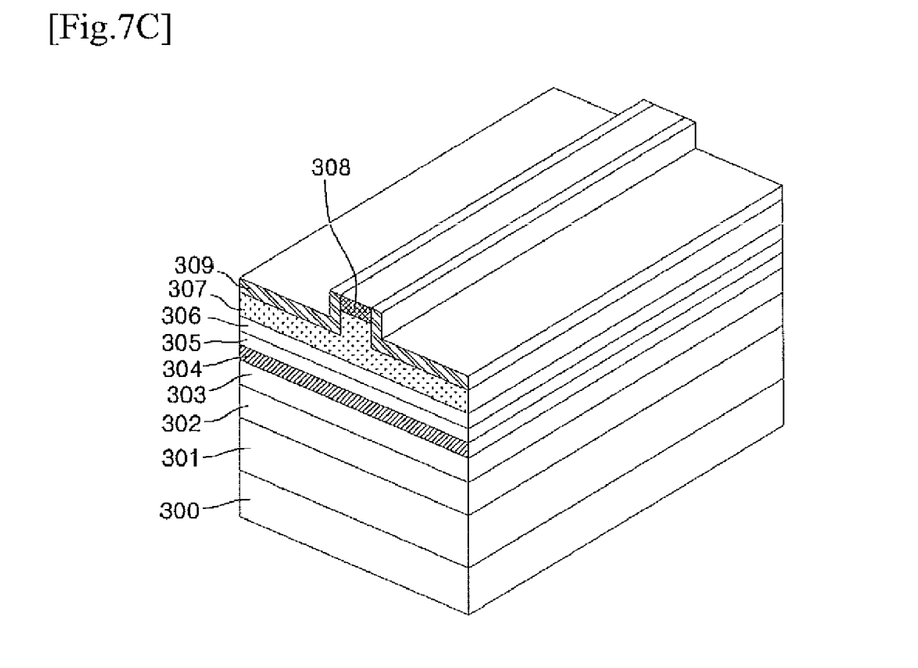
Figure 7D:
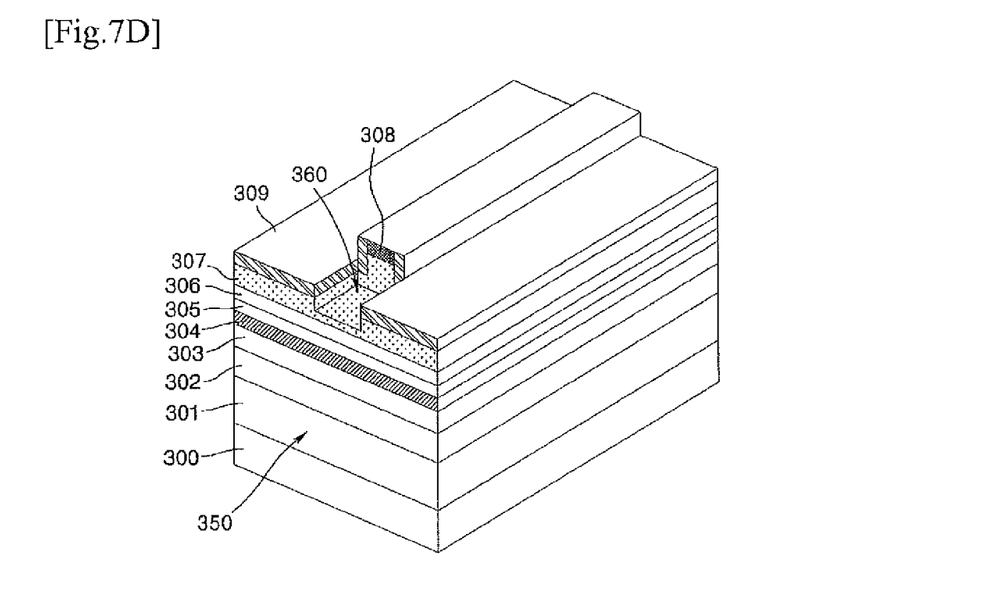

Next, the p-waveguide layer 306 is formed thereon with a central portion protruded p-clad layer 307, and the protruded p-clad layer 307 is formed thereon with the p-contact layer 308 to form a ridge (see FIG. 7b).

Successively, a protective film 309 is formed on the lateral surface of the ridge and the upper surface of the p-clad layer 307 (see FIG. 7c), and the ridge adjacent to a front cleavage facet 350 and part of the p-clad layer 307 are etched to form a window 360 (see FIG. 7d), where the method of forming the window is the same as described above.

Figure 7E:
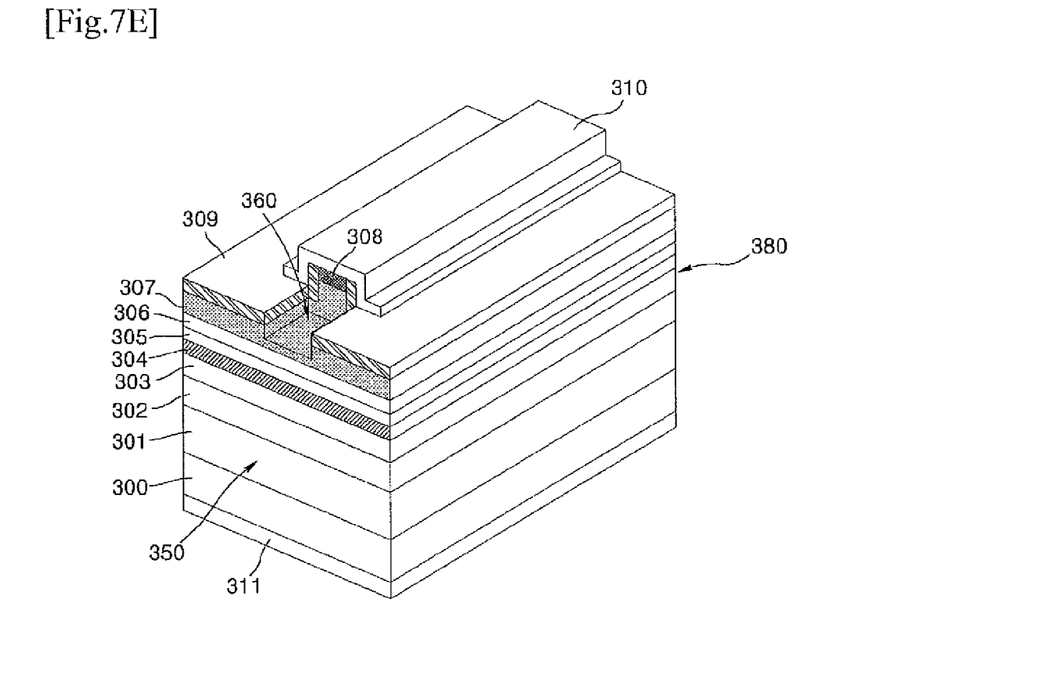

Then, a p-pad electrode 310 is formed to cover the p-contact layer 308 and part of the protective layer 309 and an n-pad electrode 311 is formed at a bottom surface of the substrate 300.

Meanwhile, in the semiconductor laser diode of the present novel concept, the window may be formed by using the photosensitive polymer as the mask to etch a region adjacent to the cleavage facet at a predetermined depth following the formation of the p-pad electrode and the n-pad electrode in the conventional method.

While the foregoing has been particularly shown and described with reference to exemplary implementations, it will be understood by those skilled in the art in view of the teachings herein that various modifications and alterations in form and details to the described implementations may be made therein without departing from the spirit and scope of the general inventive concept as defined by the appended claims and their equivalents.

What is claimed is:

1. A semiconductor laser diode formed with window comprising: a stacked structure sequentially comprised of, on an upper surface of a substrate, an n-contact layer, an n-clad layer, an n-waveguide layer, an active layer, an electron blocking layer (EBL), a p-waveguide layer; a ridge layer comprised of a p-clad layer protrusively formed at a central portion thereof on an upper surface of the p-waveguide layer and a p-contact layer formed on an upper surface of the protrusive p-clad layer; and a window formed at a predetermined depth by etching a ridge adjacent to a cleavage facet.

2. The diode as claimed in claim 1, wherein the window is formed by etching the p-contact layer of the ridge.

3. The diode as claimed in claim 1, wherein the window is formed at a region adjacent to at least any one cleavage facet out of front and back cleavage facets.

4. The diode as claimed in claim 1, wherein a length of the window is in the range of 1~300 μm.

5. The diode as claimed in claim 1, wherein a distance between the active layer and the window is in the range of 1000~5000 Å.

6. A semiconductor laser diode formed window comprising: a substrate sequentially formed thereon with an n-contact layer, an n-clad layer, an n-waveguide layer, an active layer, an electron blocking layer (EBL), a p-waveguide layer; the n-contact layer being partially exposed by being mesa-etched from the p-waveguide layer to part of the n-contact layer; a ridge formed with a p-clad layer protrusively formed at a central portion thereof on an upper surface of the p-waveguide layer and a p-contact layer formed on an upper surface of the protrusive p-clad layer; a protective film formed on a lateral surface of the ridge and the upper surface of the p-clad layer; a window formed by etching a ridge adjacent to a cleavage facet and part of the p-clad layer underneath the ridge; and a p-pad electrode formed to cover the p-contact layer and the part of the protective film, and an n-pad electrode formed on the exposed n-contact layer.

7. The diode as claimed in claim 6, wherein the window is formed at a region adjacent to at least any one cleavage facet out of front and back cleavage facets.

8. The diode as claimed in claim 6, wherein a length of the window is in the range of 1~300 μm.

9. The diode as claimed in claim 6, wherein a distance between the active layer and the window is in the range of 1000~5000 Å.

10. A semiconductor laser diode formed with window comprising: a substrate sequentially formed thereon with an n-contact layer, an n-clad layer, an n-waveguide layer, an active layer, an electron blocking layer (EBL), a p-waveguide layer; the p-waveguide layer formed thereon with a central portion protruded p-clad layer and the protruded p-clad layer being formed thereon with the p-contact layer to form a ridge; a protective film formed on a lateral surface of the ridge and the upper surface of the p-clad layer; a window formed by etching by etching a ridge adjacent to a cleavage facet and part of the p-clad layer underneath the ridge; and a p-pad electrode formed to cover the p-contact layer and the part of the protective film, and an n-pad electrode formed at a bottom surface of the substrate.

11. The diode as claimed in claim 10, wherein the substrate is an n-GaN substrate.

12. The diode as claimed in claim 10, wherein the window is formed at a region adjacent to at least any one cleavage facet out of front and back cleavage facets.

13. The diode as claimed in claim 10, wherein a length of the window is in the range of 1~300 μm.

14. The diode as claimed in claim 10, wherein a distance between the active layer and the window is in the range of 1000~5000 Å.

15. A method for fabricating a semiconductor laser diode formed with window may comprising: sequentially stacking on an upper surface of a substrate an n-contact layer, an n-clad layer, an n-waveguide layer, an active layer, an electron blocking layer (EBL) and a p-waveguide layer; mesa-etching from the p-waveguide layer to part of the n-contact layer to expose part of the n-contact layer; forming on the p-waveguide layer a central portion protruded p-clad layer and forming a p-contact layer on the protruded p-clad layer to form a ridge; forming a protective film on a lateral surface of the ridge and an upper surface of the p-clad layer; etching the ridge adjacent to a cleavage facet and part of the p-clad layer underneath the ridge to form a window; and covering the p-contact layer and part of the protective layer to form a p-pad electrode and forming an n-pad electrode at an upper surface of the exposed n-contact layer.

16. The method as claimed in claim 15, wherein the step of forming the window comprises: sequentially forming a hard mask and a photosensitive polymer on an upper surface of the p-contact layer and the protective film; patterning the photosensitive polymer in order to expose a region adjacent to the cleavage facet and then etching the hard mask; etching by using the hard mask as the etch mask from the p-contact layer adjacent to the cleavage facet to part of the p-clad layer.

17. The method as claimed in claim 15, wherein the hard mask comprises any one material selected from a group consisting of Ni, Cr, Pt, Cu, Ti, Al, $SiO_2$, SiN, $Al_2O_3$ and $TiO_2$.

18. A method for fabricating a semiconductor laser diode formed with window comprising: sequentially stacking on an upper surface of a substrate an n-contact layer, an n-clad layer, an n-waveguide layer, an active layer, an electron blocking layer (EBL) and a p-waveguide layer; forming on the p-waveguide layer a central portion protruded p-clad layer and forming a p-contact layer on the protruded p-clad layer to form a ridge; forming a protective film on a lateral surface of the ridge and an upper surface of the p-clad layer; etching the ridge adjacent to a cleavage facet and part of the p-clad layer underneath the ridge to form a window; and covering the p-contact layer and part of the protective layer to form a p-pad electrode and forming an n-pad electrode at a bottom surface of the substrate.

19. The method as claimed in claim 18, wherein the step of forming the window comprises: sequentially forming a hard mask and a photosensitive polymer on an upper surface of the p-contact layer and the protective film; patterning the photosensitive polymer in order to expose a region adjacent to the cleavage facet and then etching the hard mask; etching by using the hard mask as the etch mask from the p-contact layer adjacent to the cleavage facet to part of the p-clad layer.

20. The method as claimed in claim 19, wherein the hard mask comprises any one material selected from a group consisting of Ni, Cr, Pt, Cu, Ti, Al, $SiO_2$, SiN, $Al_2O_3$ and $TiO_2$.

* * * * *